(12) United States Patent
Dhong et al.

(10) Patent No.: US 6,175,535 B1
(45) Date of Patent: Jan. 16, 2001

(54) CYCLE CONTROL CIRCUIT FOR EXTENDING A CYCLE PERIOD OF A DYNAMIC MEMORY DEVICE SUBARRAY

(75) Inventors: Sang Hoo Dhong, Austin, TX (US); Manabu Ohkubo, Otsu; Shohji Onishi, Camoh-gun, both of (JP); Osamu Takahashi, Round Rock, TX (US)

(73) Assignee: International Business Machines Corporation, Armonk, NY (US)

( * ) Notice: Under 35 U.S.C. 154(b), the term of this patent shall be extended for 0 days.

(21) Appl. No.: 09/490,405

(22) Filed: Jan. 24, 2000

(51) Int. Cl.[7] .................................................. G11C 8/00
(52) U.S. Cl. ................ 365/236; 365/189.07; 365/230.08
(58) Field of Search .............................. 365/236, 230.08, 365/233, 189.07

(56) References Cited

U.S. PATENT DOCUMENTS

| 5,923,612 | * | 7/1999 | Park et al. ........................... 365/236 |
| 5,946,265 | * | 8/1999 | Cowles ................................. 365/236 |
| 5,946,269 | * | 8/1999 | Jang ..................................... 365/236 |
| 6,005,818 |   | 12/1999 | Ferrant ................................ 365/222 |

* cited by examiner

Primary Examiner—Son T. Dinh
(74) Attorney, Agent, or Firm—Casimer K. Saslys; Felsman, Bradley, Vaden, Gunter & Dillon, LLP

(57) ABSTRACT

A cycle control circuit for use with a memory device subarray and method of operation thereof. The cycle control circuit includes a previous address buffer for storing a last accessed address of the subarray and an address comparator for comparing a current requested address with the last accessed address in the previous address buffer. The cycle control circuit also includes a cycle counter, coupled to the address comparator, that receives a control signal generated by the address comparator and, in response thereto, modifies a reset operation of the subarray. In another aspect, the method includes applying an address to the subarray and generating control signals for the subarray to produce a data output in response to the address. After producing the data output, the applied address is stored. Next, a new address is received and the new address is compared to the stored address. In response to the stored and new addresses being the same, the reset operation of the subarray is modified to again generate the data output in a shorter period of time.

20 Claims, 5 Drawing Sheets

CYCLE CONTROL CIRCUIT FOR EXTENDING A CYCLE PERIOD OF A DYNAMIC MEMORY DEVICE SUBARRAY

BACKGROUND OF THE INVENTION

1. Technical Field of the Invention

The present invention relates generally to memory devices and in particular to dynamic random access memory (DRAM) devices. Still more particularly, the present invention relates to a cycle control circuit for extending a cycle period of a dynamic memory device subarray and a method of operation thereof.

2. Description of the Related Art

As the computer industry evolves, demands for memory have out-paced the technology of available memory devices. One of these demands is for high speed memory compatibility. Thus, in a computer system, such as a personal computer or other computing system, memory subsystems have become an influential component in the overall performance of a system.

Generally, volatile memories are either dynamic random access memory (DRAM) or static random access memory (SRAM). Typically within a SRAM cell, there are a number of transistors and data is stored by the state of a flip-flop circuit formed by some of the transistors. As long as power is supplied, the flip-flop circuit maintains its data, i.e., refreshing is not required. A DRAM device generally contains a number of subarrays, each of which having a memory cell array of individual memory cells that are typically organized in a matrix fashion of rows and columns. Each memory cell in the DRAM usually has a single transistor and a single capacitor. A data signal written into a DRAM memory cell is stored in its associated capacitor and the logic state of the data signal is determined by the charge level of the capacitor. The capacitor, however, will dissipate its charge over time and requires periodic refreshing to maintain its charge.

The two types of volatile memory devices described above have their respective advantages and disadvantages. With respect to memory speed, the SRAM is generally faster than the DRAM due, partially in part, to the nature of the individual cells. The disadvantage with SRAM, however, is that because there are more transistors that make up each SRAM cell, the SRAM is less dense than a DRAM of the same physical size. To illustrate, SRAMs traditionally have a maximum of one-fourth the number of memory cells of a DRAM that uses the same technology. While the DRAM has the advantage of smaller cells and thus higher cell density, one disadvantage is that the DRAM must periodically refresh its memory cells. When the DRAM refreshes and precharges, access to the cells is prohibited, thus resulting in an increase in access time.

A synchronous DRAM controls the memory operations on the memory cells in each subarray using a cycle control methodology. A cycle time is predefined for memory operations, such as READ and WRITE, that includes the time for completing the memory operation and resetting, i.e., refreshing and precharging, the subarray before the next memory operation on the subarray. The subarray cycle time is dependent on the hardware implementation of the DRAM and the clock speed utilized. The subarray cycle time of DRAMs is also longer than the read/write access time of the DRAMs. For example, utilizing a gigahertz clock speed, the subarray cycle time may be 12 ns (12 clock cycles) while the address access time may be only 3.7ns (about 4 clock cycles). After the memory cells in a DRAM subarray are accessed for either a READ or WRITE operation, all of the array structure within that subarray must be reset. As mentioned previously, during this reset period the subarray cannot be accessed until it is reset completely. Thus, if the same address in a subarray needs to be accessed in a consecutive manner, the second operation must be placed "on hold" until the previous subarray cycle is completed, resulting in a long memory access time.

Accordingly, what is needed in the art is an improved memory access scheme that overcomes the above-discussed limitations.

SUMMARY OF THE INVENTION

It is therefore an object of the present invention to provide an improved dynamic random access memory (DRAM) device.

It is another object of the present invention to provide a cycle control circuit for extending a cycle period of a dynamic memory device subarray and a method of operation thereof.

To achieve the foregoing objects, and in accordance with the invention as embodied and broadly described herein, a cycle control circuit for use with a memory device subarray is disclosed. The cycle control circuit includes a previous address buffer for storing a last accessed address of the subarray and an address comparator for comparing a current requested address with the last accessed address in the previous address buffer. The cycle control circuit also includes a cycle counter, coupled to the address comparator, that receives a control signal generated by the address comparator and, in response thereto, modifies a reset operation of the subarray. In a related embodiment, the memory device is a synchronous dynamic random access memory (DRAM) device.

The present invention introduces the broad concept of extending a cycle time of a memory device subarray when encountering consecutive memory operations on the same address, thus facilitating more efficient memory access. The novel cycle control circuit disclosed by the present invention significantly reduces the memory access time when the same address in the subarray is accessed by consecutive memory operations. This is accomplished by extending the subarray cycle time, thus delaying the resetting of the subarray to allow multiple READ operations at the same subarray address in one subarray cycle.

In another aspect of the present invention, the method disclosed by the present invention includes applying an address to the subarray and generating control signals for the subarray to produce a data output in response to the address. After producing the data output, the applied address is stored. Next, a new address is received and the new address is compared to the stored address. In response to the stored and new addresses being the same, the reset operation of the subarray is modified to again generate the data output in a shorter period of time.

The foregoing description has outlined, rather broadly, preferred and alternative features of the present invention so that those skilled in the art may better understand the detailed description of the invention that follows. Additional features of the invention will be described hereinafter that form the subject matter of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
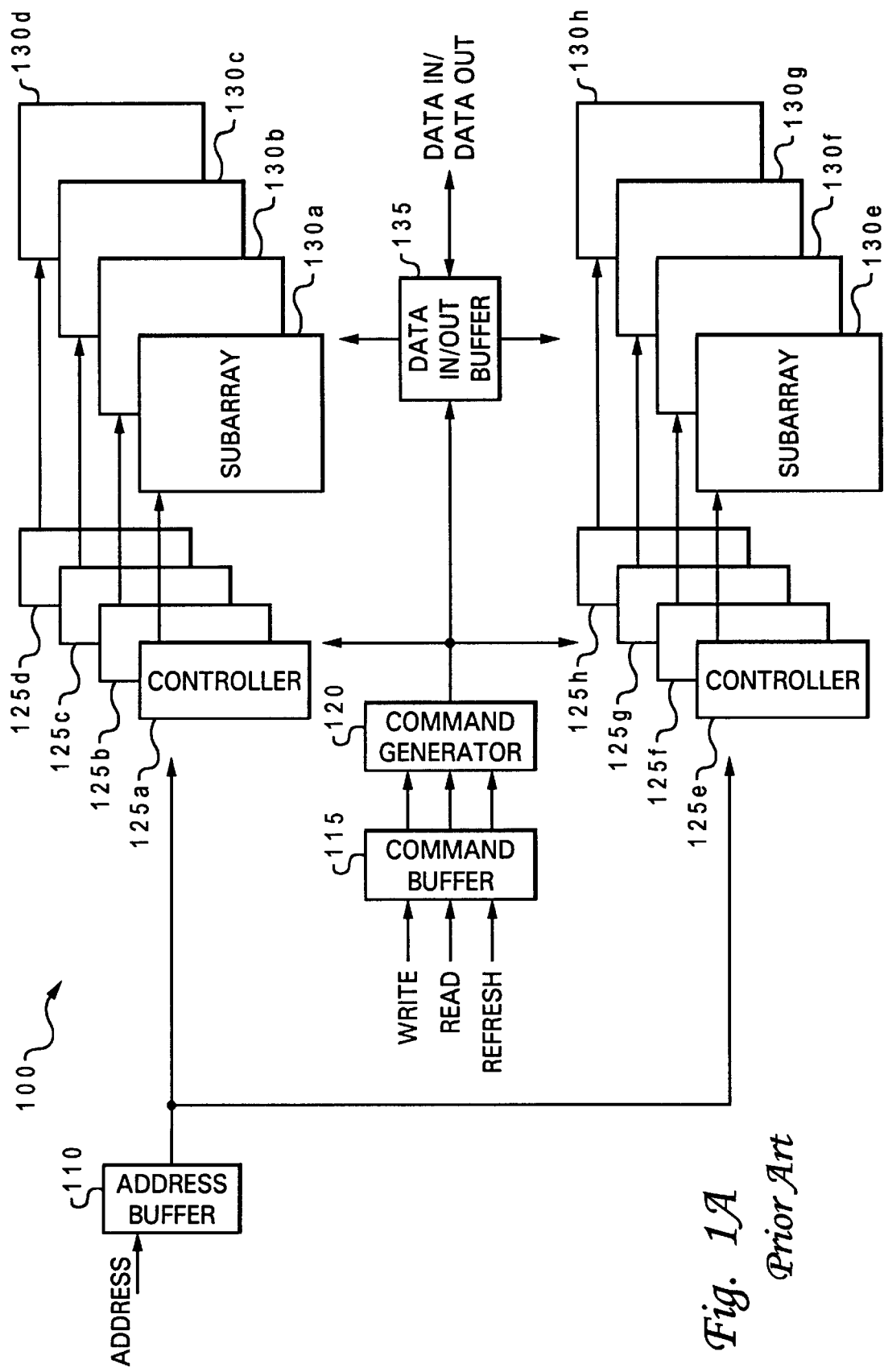
FIG. 1A illustrates an exemplary high-level simplified block diagram of a dynamic random access memory (DRAM) device that provides a suitable environment for the practice of the present invention.

With reference now to the figures, and in particular, with reference to FIG. 1A, there is depicted an exemplary high-level simplified block diagram of a dynamic random access memory (DRAM) device 100 that provides a suitable environment for the practice of the present invention. DRAM 100 includes a plurality of subarrays, generally designated 130a–130h, that are coupled to a corresponding plurality of subarray controllers, also designated 125a–125h, that provide word-line drivers not shown for subarrays 130a–130h containing memory cells (not shown). Although DRAM 100 is illustrated with eight independent subarrays for simplicity, in a preferred embodiment, DRAM 100 is operated synchronously with sixteen independent subarrays with a gigahertz central processing unit (CPU) clock in a fully pipelined fashion. In an advantageous embodiment, each subarray contains 512 Kb. It should be noted, however, that the present invention does not contemplate limiting its practice to any one particular size subarray or clock speed.

Generally, DRAM 100 receives four external signals: one clock (not shown) and three commands, i.e., READ, WRITE and REFRESH. DRAM 100 also receives a multi-bit address signal at address buffer 110 and can typically generate a 1280 bit output at data IN/OUT buffer 135 at every 1 ns clock cycle (assuming a gigahertz clock is utilized). The address of a data to be read is received at address buffer 100 and provided to the respective subarray controller that contain the word-line driver circuitry. The READ, WRITE and REFRESH commands, on the other hand, are received at command buffer 115 and forwarded on to a command generator 120. Command generator 120 then proceeds to route the specified command to the respective subarray controller and to data IN/OUT buffer 135.

Figure 1B:
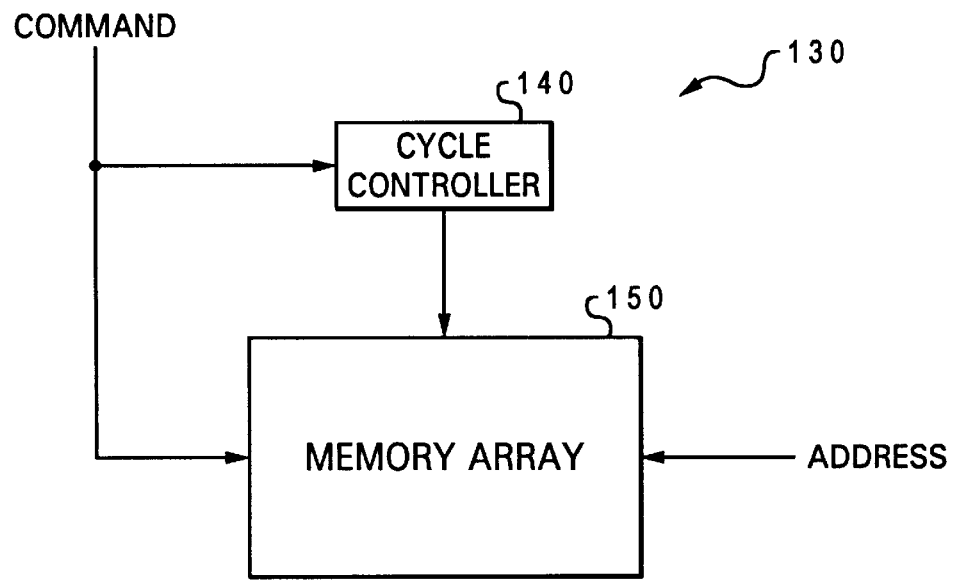
FIG. 1B illustrates a high-level block diagram of a conventional subarray.

A high-level block diagram of a conventional subarray, designated 130, is illustrated in FIG. 1B that includes a memory array 150 of memory cells (not shown) coupled to a conventional cycle controller 140 that controls the memory operations of subarray 130. The memory operations of DRAM 100 will hereinafter be described with respect to FIG. 2, with continuing reference to FIGS. 1A and 1B.

Figure 2:
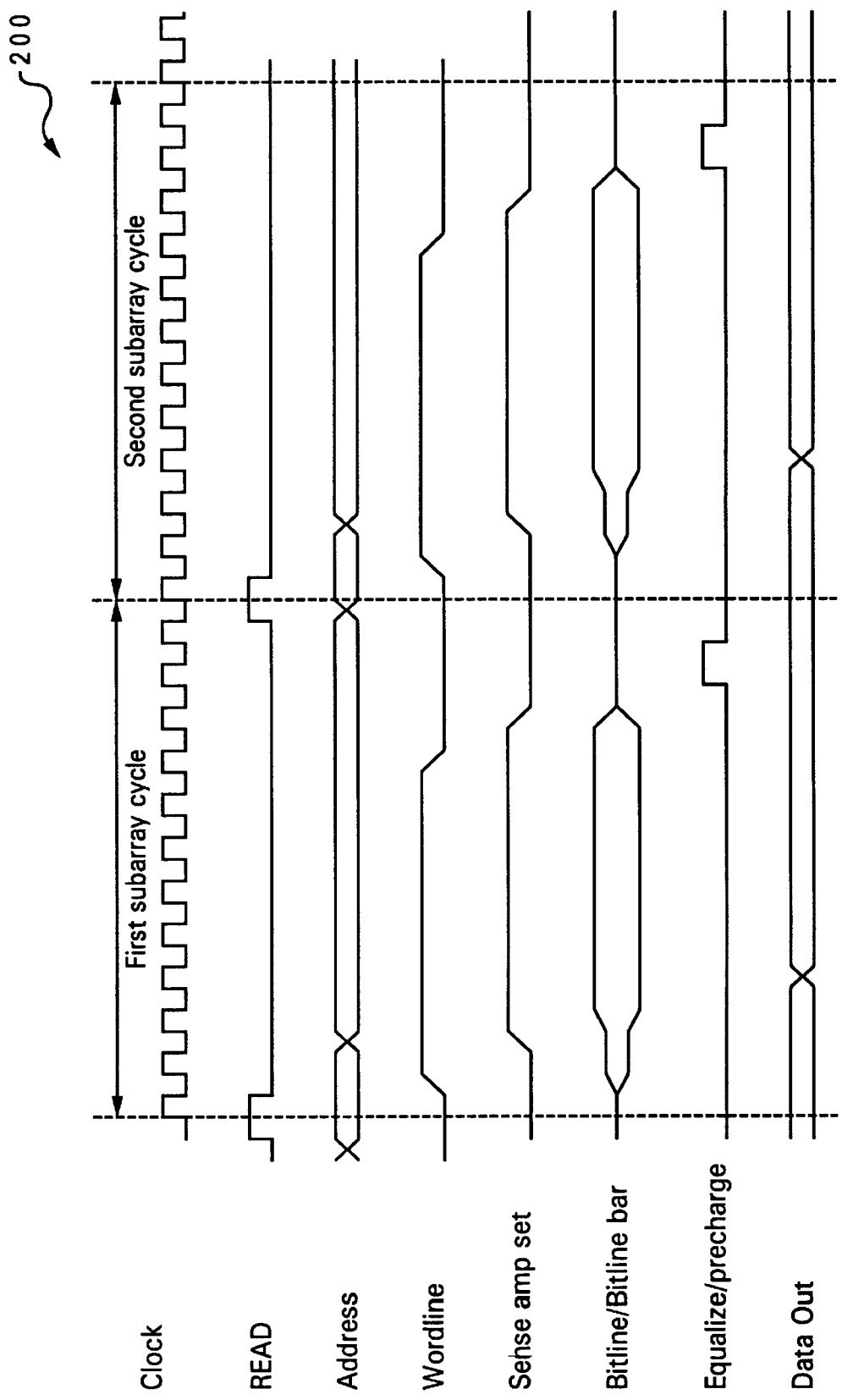
FIG. 2 illustrates an exemplary timing diagram for two consecutive READ operations on an identical address in the subarray depicted in FIG. 1B.

Referring now to FIG. 2, there is illustrated an exemplary timing diagram 200 for two consecutive READ operations on an identical address in subarray 130. For illustrative purposes, subarray 130 cycle time (including access and reset cycles) is 12 ns. The subarray cycle time is controlled utilizing cycle counter 140. In the illustrated embodiment, the number of clock cycles, utilizing a gigahertz clock, is twelve to achieve a subarray cycle time of 12 ns. As discussed previously, following a READ, or alternatively a WRITE, operation on a specific address in subarray 130 requires that the memory cells in subarray 130 be reset prior to a another memory operation utilizing subarray 130. This in turn slows down the throughput of DRAM 100 since the second READ operation is prevented from execution until the first READ operation, or subarray cycle, is completed. As shown in FIG. 2, consecutive READ operations on the same address in subarray 130 requires two subarray cycle times for a total time of 24 ns even if the second consecutive READ is at the same address in subarray 130.

Figure 3:
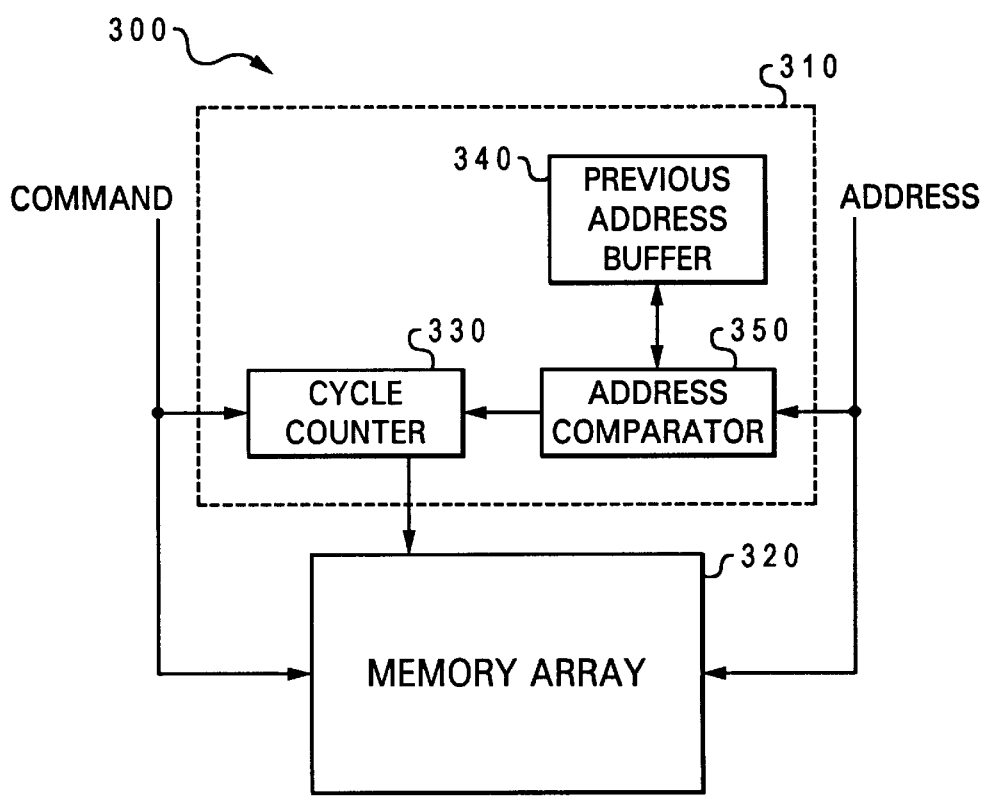
FIG. 3 illustrates a block diagram of a subarray utilizing an embodiment of a cycle control circuit constructed according to the principles of the present invention.

Referring now to FIG. 3, there is depicted a block diagram of a subarray 300 utilizing an embodiment of a cycle control circuit 310 constructed according to the principles of the present invention. Subarray 300, analogous to subarray 130 illustrated in FIG. 1B, includes a memory array 320 that contains a plurality of memory cells (not shown). Typically, each memory cell is made up of a single transistor and a single capacitor. The memory cells are generally organized in a matrix fashion, each memory cell is uniquely identified by its row and column locations. Memory array 320 is coupled to cycle control circuit 310 that includes a cycle counter 330, a previous address buffer 340 and an address comparator 350. In an advantageous embodiment, both previous address buffer 340 and address comparator 350 are implemented in cycle control circuit 310 utilizing conventional registers. It should be readily apparent to those skilled in the art that address buffer 340 and address comparator 350, in other advantageous embodiments, may also be implemented in software or firmware, or any combination thereof. Cycle counter 330 is utilized to control the time periods of memory operations, such as READs, and typically implemented utilizing a conventional state machine. The state machine also generates the necessary timing, or control, signals for activation of the word-lines, setting of the bit-line sense amplifiers, resetting the word-lines and pre-charging the bit-lines to half of a supply voltage Vdd.

Figure 4:
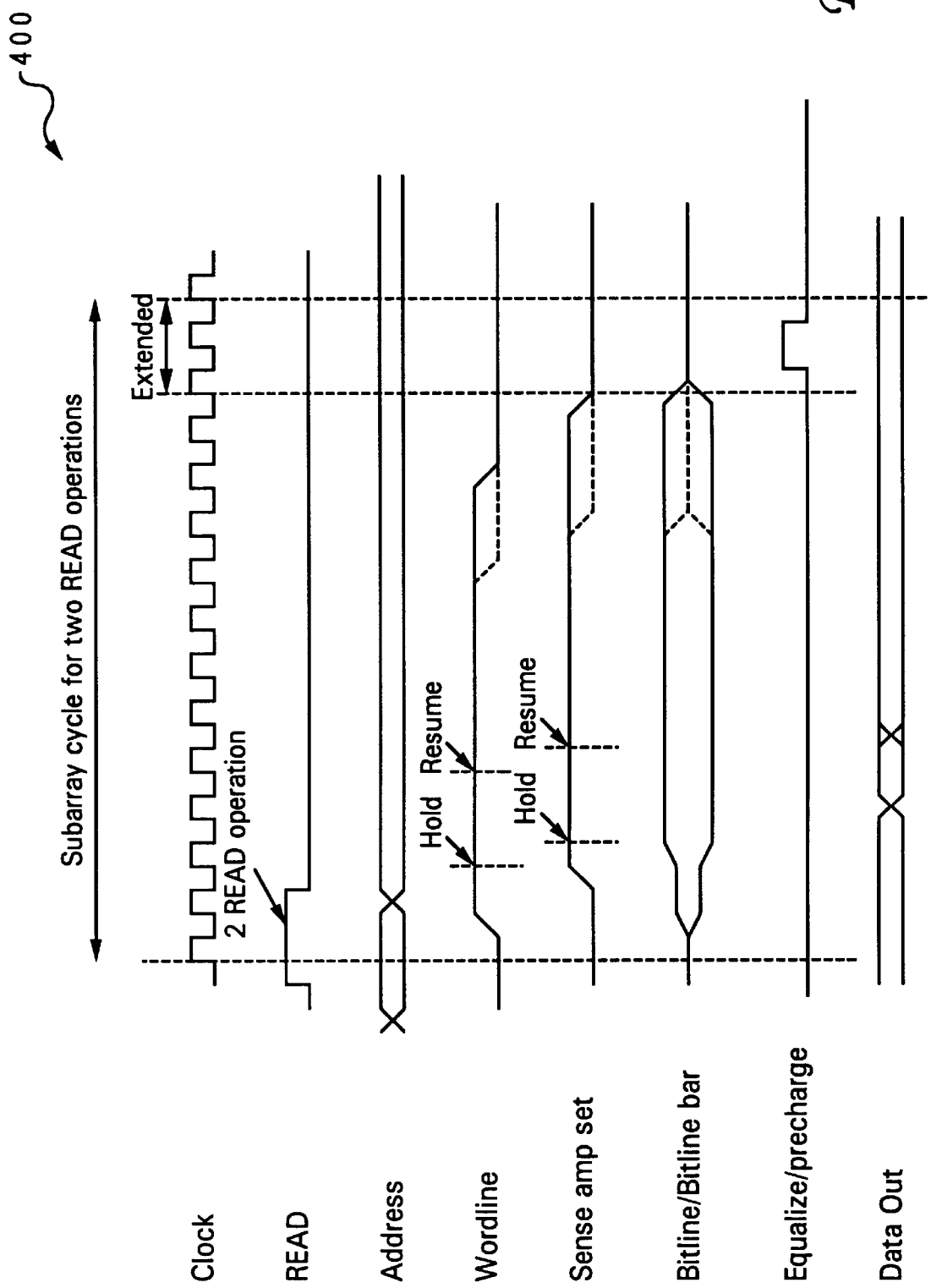
FIG. 4 illustrates an exemplary timing diagram depicting two consecutive READ operations on an identical address in the subarray depicted in FIG. 3.

Turning now to FIG. 4, with continuing reference to FIG. 3, there is illustrated an exemplary timing diagram 400 depicting two consecutive READ operations on an identical address in subarray 300. Initially, a READ command and address location is received at command and address buffers (analogous to command buffer 115 and address buffer 110 depicted in FIG. 1). The READ command is subsequently provided to cycle counter 330 and memory array 320, while the address, containing the row and column addresses of the memory cell location, is forwarded to address comparator 350 and memory array 320. At this time, it is assumed (for illustrative purposes) that the last address accessed in subarray 300 is not the same address as the current requested address. It is further assumed that the memory array structures have also been reset. Since the current requested address is not the same as the last accessed address (presently stored in previous address buffer 340), the current requested address is stored in previous address buffer 340, replacing the last accessed address. Concurrently, with the receipt of the READ signal, cycle counter 330 is initiated to begin the cycle count. For the illustrated embodiment, the cycle time is 12 clock cycles for a READ operation. It should be noted that the cycle time is dependent on the clock signal employed and the hardware implementation of subarray 300.

Following the receipt of the READ signal, a word-line is then selected in each of the row decoders (not shown) in response to the row addresses in the requested address signal and raised to a high-level. The bit-line pair are also brought at this time to about one-half (½) of supply voltage Vdd. Next, the sense amplifiers are turned on. Consequently, the small difference in voltages between the bit-line pair are amplified, so that one of the bit-line pair is driven high while the other bit-line is driven low. At this time, a data signal stored at the memory cell at the address requested is applied to the bit-line. This data signal is then amplified by the sense amplifiers and thereby applied to a read/write I/O line that ultimately transfers the data signal to a data IN/OUT buffer (analogous to data IN/OUT buffer 135 depicted in FIG. 1).

Following the initiation of the first READ operation and unlike the prior art cycle control schemes, the cycle control circuit 310, prior to initiating a precharge/equalize operation to reset memory array 320 at the end of the subarray cycle, determines if the next requested READ address is the same as the current requested address. The next requested address is compared at address comparator 350 with the current requested address that is stored at previous address buffer 340. Following the comparison, the new address replaces the previous address stored in previous address buffer 340. If it is determined that the two address are not identical, cycle counter 330 continues normal operation and resets the memory array at the end of the cycle time. However, if it is determined that the two addresses are identical, address comparator 350 generates a control signal to cycle counter 330 to extend the cycle time an additional X clock cycles (where X is a number greater than 1) to allow the second READ operation to complete before resetting memory array 320. In a preferred embodiment, the cycle time is extended for two additional clock cycles. However, it should be noted that the additional time is dependent on the hardware implementation of subarray 300 and/or clock speed employed. As illustrated the exemplary timing diagram 400 depicted in FIG. 4, a second consecutive READ is also requesting the same address. Thus, the READ signal comprises two clock cycles as shown and consequently, the Wordline, sense amp set and Bitline/Bitline bar signals are also extended for an additional two clock cycles allowing for the second READ operation to be completed before resetting memory array 320. Furthermore, if the next successive READ operation is also requesting the same address as the previous two READ operations, address comparator 350 continues to generate a control signal placing cycle counter 330 in a "hold" mode until a different address is encountered or a WRITE operation is initiated.

Thus, the subarray cycle is extended by X times the number of subsequent operations where an identical address is accessed. In other words, the total number of clock cycles required for the case of consecutive operations on an identical address is (subarray cycle time)+X*(number of subsequent operations) rather than (subarray cycle time)*(number of operations), resulting in a significant reduction in memory access time.

Figure 5:
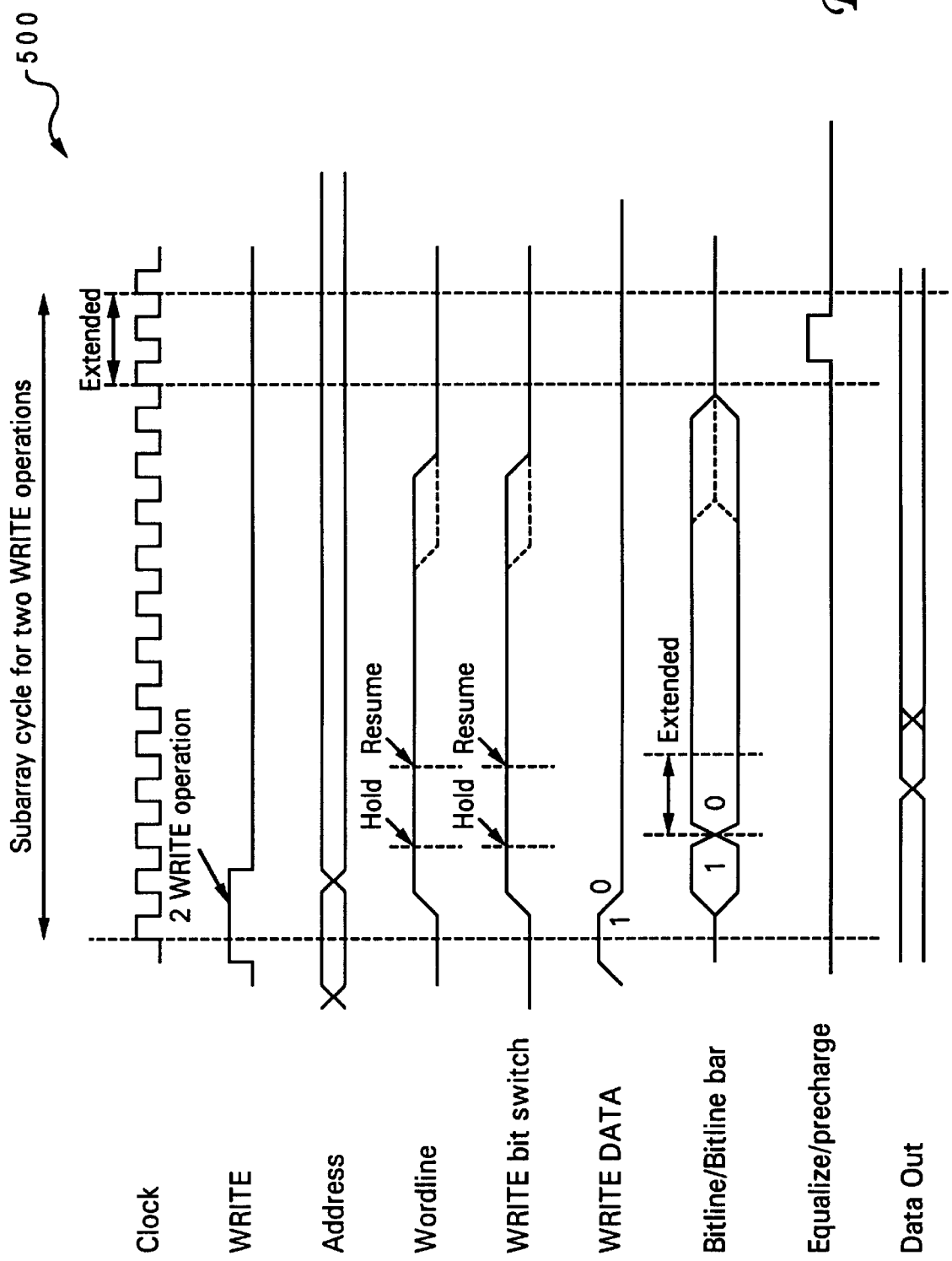
FIG. 5 illustrates an exemplary timing diagram depicting two consecutive WRITE operations on an identical address in subarray depicted in FIG. 3.

Although the practice of the present invention has been described in the context of READ memory operations, those skilled in the art should readily appreciate that the advantages discussed above are also realized with WRITE memory operations. FIG. 5 depicts an exemplary timing diagram 500 depicting two consecutive WRITE operations on an identical address in subarray 300.

The present invention may be embodied in other specific forms without departing from its spirit or essential characteristics. The described embodiments are to be considered in all respects as illustrative and not restrictive. The scope of the invention is, therefore, indicated by the appended claims rather than by the foregoing description. All changes which come within the meaning and range of equivalency of the claims are to be embraced within their scope.

What is claimed is:

1. A cycle control circuit for use with a memory device subarray, comprising:
   a previous address buffer storing a last accessed address of said subarray;
   an address comparator that compares a current requested address with said last accessed address in said previous address buffer and, in response thereto, generates a control signal; and
   a cycle counter, coupled to said address comparator, that receives said control signal and, in response thereto, modifies a reset operation of said subarray.

2. The cycle control circuit as recited in claim 1 wherein said memory device is a dynamic random access memory (DRAM).

3. The cycle control circuit as recited in claim 2 wherein said DRAM is controlled synchronously.

4. The cycle control circuit as recited in claim 1 wherein said cycle counter is implemented utilizing a state machine.

5. The cycle control circuit as recited in claim 1 wherein said previous address buffer and address comparator are registers.

6. The cycle control circuit as recited in claim 1 wherein said control signal extends a period of time before resetting said subarray.

7. The cycle control circuit as recited in claim 6 wherein said extending a period of time includes increasing the number of clock cycles in a cycle time of said subarray.

8. A method of controlling a reset operation of a memory device subarray, comprising the steps of:
   applying an address to said subarray and generating control signals for said subarray to produce a data output in response to said address;
   storing said address;
   receiving a new address and comparing said new address to said stored address; and
   modifying said reset operation, in response to said stored and new addresses being the same, to again generate said data output in a shorter period of time.

9. The method as recited in claim 8 wherein said step of storing said address includes the step of storing said address in a previous address buffer.

10. The method as recited in claim 9 wherein said step of receiving a new address includes the step of comparing said new address to said stored address utilizing an address comparator.

11. The method as recited in claim 10 wherein said previous address buffer and address comparator are registers.

12. The method as recited in claim 8 wherein said step of modifying said control signals includes the step of extending a cycle time before resetting said subarray.

13. The method as recited in claim 12 wherein said step of extending a cycle time includes the step of increasing a number of clock cycles in said cycle time.

14. The method as recited in claim 12 wherein said cycle time is controlled utilizing a cycle counter.

15. The method as recited in claim 8 wherein said memory device is a synchronous dynamic random access memory (DRAM).

16. A synchronous dynamic random access memory (DRAM) device, comprising:

a plurality of subarrays, wherein each of said plurality of subarrays including:
a memory array; and
a subarray control block, coupled to said memory array, said subarray control block including a cycle control circuit comprising:
a previous address buffer storing a last accessed address of said subarray;
an address comparator that compares a current requested address with said last accessed address in said previous address buffer and, in response thereto, generates a control signal; and
a cycle counter, coupled to said address comparator, that receives said control signal and, in response thereto, modifies a reset operation of said subarray.

17. The DRAM as recited in claim 16 further comprising:
an address buffer;
a command buffer; and
a data IN/OUT buffer.

18. The DRAM as recited in claim 16 wherein said cycle counter is implemented utilizing a state machine.

19. The DRAM as recited in claim 16 wherein said previous address buffer and address comparator are registers.

20. The DRAM as recited in claim 16 wherein said control signal extends a period of time before resetting said subarray.

* * * * *

UNITED STATES PATENT AND TRADEMARK OFFICE
CERTIFICATE OF CORRECTION

PATENT NO. : 6,175,535 B1  
DATED : January 16, 2001  
INVENTOR(S) : Dhong et al.

Page 1 of 1

It is certified that error appears in the above-identified patent and that said Letters Patent is hereby corrected as shown below:

<u>Column 2,</u>  
Line 5, please delete "Saslys" and insert -- Salys --.

Signed and Sealed this

Twenty-seventh Day of November, 2001

Attest:

NICHOLAS P. GODICI  
*Attesting Officer*  
*Acting Director of the United States Patent and Trademark Office*